United States Patent
Sun et al.

(10) Patent No.: US 8,658,476 B1
(45) Date of Patent: Feb. 25, 2014

(54) LOW TEMPERATURE P+ POLYCRYSTALLINE SILICON MATERIAL FOR NON-VOLATILE MEMORY DEVICE

(75) Inventors: Xin Sun, Albany, CA (US); Sung Hyun Jo, Sunnyvale, CA (US); Tanmay Kumar, Pleasanton, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/452,657

(22) Filed: Apr. 20, 2012

(51) Int. Cl.
| | |
|---|---|
| H01L 27/112 | (2006.01) |
| H01L 21/82 | (2006.01) |
| H01L 21/20 | (2006.01) |
| H01L 29/04 | (2006.01) |
| H01L 29/06 | (2006.01) |
| H01L 29/10 | (2006.01) |

(52) U.S. Cl.
USPC ........... 438/132; 438/129; 438/381; 438/629; 257/2; 257/3; 257/4; 257/5; 257/43

(58) Field of Classification Search
USPC .......... 438/132, 129, 381, 382, 624; 257/2, 3, 257/4, 5, 43, E45.002, E21.09
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,714,416 A | 2/1998 | Eichman et al. |
| 5,751,012 A | 5/1998 | Wolstenholme et al. |
| 5,840,608 A | 11/1998 | Chang |

(Continued)

FOREIGN PATENT DOCUMENTS

KR 1020110014248 A 2/2011

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Ha Tran T Nguyen
*Assistant Examiner* — Thai T Vuong
(74) *Attorney, Agent, or Firm* — Ogawa P.C.

(57) ABSTRACT

A method of forming a non-volatile memory device. The method includes providing a substrate having a surface region and forming a first dielectric material overlying the surface region of the substrate. A first electrode structure is formed overlying the first dielectric material and a p+ polycrystalline silicon germanium material is formed overlying the first electrode structure. A p+ polycrystalline silicon material is formed overlying the first electrode structure using the polycrystalline silicon germanium material as a seed layer at a deposition temperature ranging from about 430 Degree Celsius to about 475 Degree Celsius without further anneal. The method forms a resistive switching material overlying the polycrystalline silicon material, and a second electrode structure including an active metal material overlying the resistive switching material.

22 Claims, 9 Drawing Sheets

(56) References Cited

U.S. PATENT DOCUMENTS

| | | |
|---|---|---|
| 5,970,332 A | 10/1999 | Pruijmboom et al. |
| 5,998,244 A | 12/1999 | Wolstenholme et al. |
| 6,128,214 A | 10/2000 | Kuekes et al. |
| 6,143,642 A | 11/2000 | Sur, Jr. et al. |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2* | 9/2006 | Harshfield et al. ............... 257/2 |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,385,100 B2 | 2/2013 | Kau et al. |
| 2004/0026682 A1 | 2/2004 | Jiang |
| 2005/0020510 A1 | 1/2005 | Benedict |
| 2005/0029587 A1 | 2/2005 | Harshfield |
| 2005/0062045 A1* | 3/2005 | Bhattacharyya ............... 257/66 |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0087508 A1 | 4/2007 | Herner |
| 2007/0090425 A1 | 4/2007 | Kumar et al. |
| 2007/0105284 A1* | 5/2007 | Herner ............... 438/131 |
| 2007/0105390 A1 | 5/2007 | Oh |
| 2007/0205510 A1 | 9/2007 | Lavoie et al. |
| 2007/0228414 A1* | 10/2007 | Kumar et al. ............... 257/183 |
| 2007/0284575 A1 | 12/2007 | Li et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0185567 A1* | 8/2008 | Kumar et al. ............... 257/2 |
| 2008/0206931 A1 | 8/2008 | Breuil et al. |
| 2008/0278990 A1* | 11/2008 | Kumar et al. ............... 365/148 |
| 2008/0304312 A1 | 12/2008 | Ho et al. |
| 2008/0311722 A1 | 12/2008 | Petti et al. |
| 2009/0014707 A1* | 1/2009 | Lu et al. ............... 257/4 |
| 2009/0052226 A1 | 2/2009 | Lee et al. |
| 2009/0095951 A1* | 4/2009 | Kostylev et al. ............... 257/4 |
| 2009/0152737 A1 | 6/2009 | Harshfield |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0298224 A1* | 12/2009 | Lowrey ............... 438/102 |
| 2009/0321789 A1 | 12/2009 | Wang et al. |
| 2010/0012914 A1* | 1/2010 | Xu et al. ............... 257/2 |
| 2010/0019221 A1* | 1/2010 | Lung et al. ............... 257/5 |
| 2010/0019310 A1 | 1/2010 | Sakamoto |
| 2010/0084625 A1* | 4/2010 | Wicker et al. ............... 257/4 |
| 2010/0085798 A1 | 4/2010 | Lu et al. |
| 2010/0090192 A1* | 4/2010 | Goux et al. ............... 257/4 |
| 2010/0101290 A1 | 4/2010 | Bertolotto |
| 2010/0102290 A1 | 4/2010 | Lu et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0305064 A1 | 12/2011 | Jo et al. |
| 2011/0317470 A1 | 12/2011 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043654 A1 | 2/2012 | Lu et al. |
| 2012/0074507 A1 | 3/2012 | Jo et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0145984 A1 | 6/2012 | Rabkin et al. |
| 2012/0155146 A1 | 6/2012 | Ueda et al. |

(56) References Cited

U.S. PATENT DOCUMENTS

| | | |
|---|---|---|
| 2012/0205606 A1 | 8/2012 | Lee et al. |
| 2012/0235112 A1 | 9/2012 | Huo et al. |
| 2012/0252183 A1 | 10/2012 | Herner |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

Notice of Allowance for U.S. Appl. No. 13/158,231 dated Apr. 17, 2012.

Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.

International Search Report and Written Opinion for PCT/US2011/046035 filed on Jul. 29, 2011.

Office Action for U.S. Appl. No. 12/861,650 dated Jan. 25, 2012.
Notice of Allowance for U.S. Appl. No. 12/861,650 dated Jun. 19, 2012.

Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.

Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., "Si-Based Two-Terminal Resistive Switching Nonvolatile Memory", IEEE, 2008.

Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.

Wei Lu et al., "Nanoelectronics from the bottom up", Nature Materials, www.nature.com/naturematerials, Nov. 2007, pp. 841-850, vol. 6, Nature Publishing Group.

Sung Hyun Jo et al., "Ag/a-Si:H/c—Si Resistive Switching Nonvolatile Memory Devices", Nanotechnology Materials and Devices Conference, IEEE, 2006, pp. 116-117, vol. 1.

Sung Hyun Jo et al., "Experimental, Modeling and Simulation Studies of Nanoscale Resistance Switching Devices", 9th Conference on Nanotechnology, IEEE, 2009, pp. 493-495.

Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.

Sung Hyun Jo et al., "Si Memristive Devices Applied to Memory and Neuromorphic Circuits", Proceedings of 2010 IEEE International Symposium on Circuits and Systems, 2010, pp. 13-16.

Wei Lu et al., "Supporting Information", 2008.

Sung Hyun Jo et al., "High-Density Crossbar Arrays Based on a Si Memristive System", Nano Letters, 2009, pp. 870-874, vol. 9 No. 2, American Chemical Society Publications.

Sung Hyun Jo et al., "High-Density Crossbar Arrays Based on a Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9 No. 1, American Chemical Society Publications.

Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.

S. K. Dey, "Electrothermal model of switching in amorphous silicon films", J. Vac. Sci. Technol., Jan./Feb. 1980, pp. 445-448, vol. 17, No. 1, American Vacuum Society.

J. Hajto et al., "The Programmability of Amorphous Silicon Analogue Memory Elements", Mat. Res. Soc. Symp. Proc., 1990, pp. 405-410, vol. 192, Materials Research Society.

(56) References Cited

OTHER PUBLICATIONS

M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/174,264, dated Oct. 16, 2013.
Notice of Allowance for U.S. Appl. No. 13/417,135, dated Oct. 23, 2013.
Office Action for U.S. Appl. No. 13/564,639, dated Dec. 6, 2013.

\* cited by examiner

LOW TEMPERATURE P+ POLYCRYSTALLINE SILICON MATERIAL FOR NON-VOLATILE MEMORY DEVICE

BACKGROUND

The present invention is related to switching devices. More particularly, the present invention provides a resistive switching device and a fabrication method compatible with conventional CMOS processes. Embodiments of the present invention have been applied to a non-volatile memory device. But it should be recognized that the present invention can have a much broader range of applicability.

The inventors of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventors of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention is related to switching devices. More particularly, the present invention provides a resistive switching device and a fabrication method compatible with conventional CMOS processes. Embodiments of the present invention have been applied to a resistive random access memory device, which is non-volatile. But it should be recognized that the present invention can have a much broader range of applicability.

In a specific embodiment, a method of forming a resistive switching device is provided. The method includes providing a substrate having a surface region. The substrate can comprises of a semiconductor material in a specific embodiment. A first dielectric material is formed overlying the surface region of the substrate and a first electrode structure is formed overlying the first dielectric material. In a specific embodiment, the first electrode structure comprises a first conductor material commonly used in a back end of process of CMOS fabrication. The method forms a polycrystalline silicon germanium material overlying the first electrode structure. In a specific embodiment, the polycrystalline silicon germanium material has a first p+ impurity characteristic. A polycrystalline silicon material is formed overlying the first electrode structure using the polycrystalline silicon germanium material as a seed layer. The polycrystalline silicon material is formed at a deposition temperature ranging from about 430 Degree Celsius to about 475 Degree Celsius. In a specific embodiment, the polycrystalline silicon material is characterized by a second p+ impurity characteristic. The method includes forming a switching material comprising an amorphous silicon material overlying the polycrystalline silicon material, and forming second electrode structure overlying the switching material The second electrode structure includes at least a portion comprising an active metal material in physical and electrical contact with the switching material. The resistive switching device is disposed in an N by M crossbar array in a specific embodiment, where N and M are integers (N≥1, M≥1), or other arrangements.

In a specific embodiment, a resistive switching device for a memory device is provided. The resistive switching device includes a first electrode, a second electrode. The second electrode includes a portion comprising an active conductive material. The resistive switching device includes a resistive switching material configured in an intersection region between the first electrode and the second electrode and configured to be in physical and electrical contact with the active conductive material. In a specific embodiment, the resistive switching device includes a buffer layer material comprising one or more silicon material having a p+ impurity characteristic disposed in between the first electrode and the resistive switching material. The buffer layer material is configured to provide a desirable switching behavior for the resistive switching device.

Many benefits can be achieved by ways of the present invention. Embodiment according to the present invention provide a method to form a polycrystalline silicon material having a desirable electrical properties at a deposition temperature of no greater than 450 Degree Celsius, well within a thermal budget to be formed ay in a backend of a CMOS processes. The dopant species (for example, boron species for a p doped) in the polycrystalline silicon material are activated during deposition and does not need an anneal process further simplify the fabrication process and enhance device yield. Additionally, the non-memory device can be fabricated using conventional semiconductor process without modification to the process equipment. Depending on the embodiment, one or more of these benefits can be realized. One skilled in the art would recognize other modifications, variations, and alternatives.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

Embodiments according to the present invention are related to switching devices. More particularly, the present invention provides a structure for resistive switching device and a fabrication method compatible with conventional CMOS processes. Embodiments of the present invention have been applied to a resistive random access memory device, which is non-volatile. But it should be recognized that embodiments according to the present invention can have a much broader range of applicability.

The terms "Top" or Bottom" are for the purpose of illustration only and should not be construed to be limiting.

Resistive switching devices usually comprise of a bottom electrode, a top electrode, and a resistive switching material sandwiched between the top electrode and the bottom electrode. Resistive switching devices using amorphous silicon or certain metal oxide, for example, zinc oxide as the resistive switching material require a buffer layer between the resistive switching material and the bottom electrode material. It is believed that switching phenomena in these devices are based on a filament structure derived from an active metal material from the top electrode formed in a portion of the resistive switching material to cause changes in a resistance characteristic of the material. The filament structure can determine the performance attributes of the resistive switching device, namely, data retention, endurance, and desirable switching characteristic, and others. The buffer layer is provided to ensure proper switching of the device under a predetermined range of switching voltage and current. Polycrystalline silicon material provides desired characteristics for the buffer layer such as desirable electric conductivity and inhibition of direct contact between the filament structure and the bottom electrode. The formation of the polycrystalline silicon material with dopant activation usually occurs at temperature greater than about 600 Degree Celsius for desirable electrical conductivity, as well known in the art.

The resistive switching device can be vertical integrated and fabricated in a backend of process for a CMOS device and should be fabricated at temperatures compatible with the underlying CMOS. Embodiments according to the present invention provide a device structure and a method to fabricate a resistive switching device at temperatures well within the thermal budget of the underlying CMOS devices.

Figure 1:
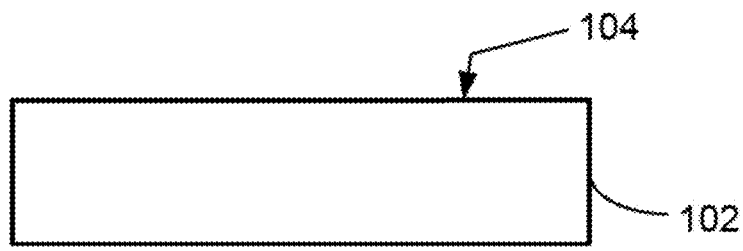
FIGS. 1-11 are simplified diagram illustrating a method of forming a resistive switching device for non-volatile memory device according to an embodiment of the present invention.

FIGS. 1-11 are simplified diagrams illustrating a method of forming a resistive switching device according to an embodiment of the present invention. As shown in FIG. 1, a semiconductor substrate 102 having a surface region 104 is provided. Semiconductor substrate 102 can be a single crystal silicon wafer, a silicon germanium material, a silicon on insulator (commonly called SOI) depending on the embodiment. In certain embodiments, semiconductor substrate 102 can have one or more MOS devices formed thereon. The one or more MOS devices can be controlling circuitry for the resistive switching device in a specific embodiment.

In various embodiments, a processor, or the like, may include resistive memory memories as described herein. Because the resistive memories are relatively non-volatile, devices such as processors, or the like using such memories may maintain state while power is not supplied to the processors. To a user, such capability would greatly enhance the power-on power-off performance of devices including such processors. Additionally, such capability would greatly reduce the power consumption of devices. In particular, because such memories are non-volatile, the processor need not draw power to refresh the memory states, as is common with CMOS type memories. Accordingly, embodiments of the present invention are directed towards processors or other logic incorporating these memory devices, devices (e.g. smart phones, network devices) incorporating such memory devices, and the like.

Figure 2:
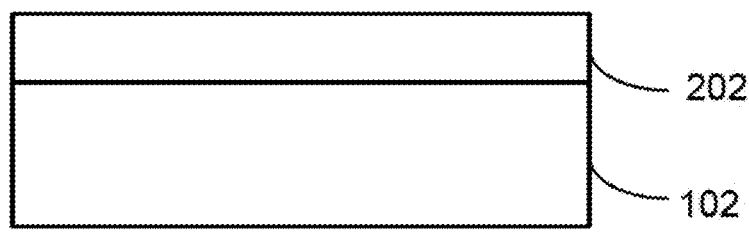
Figure 3:
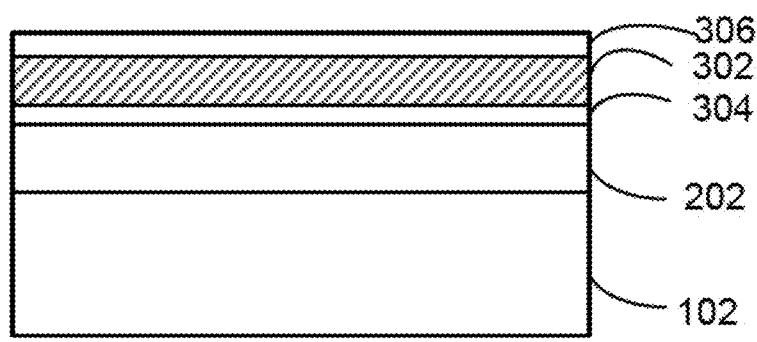

As illustrate in FIG. 2, the method includes depositing a first dielectric material 202 overlying the semiconductor substrate. First dielectric material 202 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 202 can be deposited using techniques such as chemical vapor deposition, including low pressure chemical vapor deposition, plasma enhanced chemical vapor deposition, atomic layer deposition (ALD), physical vapor deposition, including any combination of these, and others Referring to FIG. 3, the method includes depositing a first wiring material 302 overlying the first dielectric material. First wiring material 302 can be a suitable metal material including alloy materials, or a semiconductor material having a suitable conductivity characteristic. The metal material can be tungsten, aluminum, copper or silver, and others. These metal materials may be deposited using a physical vapor deposition process, chemical vapor deposition process, electroplating, or electroless deposition process, including any combinations of these, and others. The semiconductor material can be, for example, a suitably doped silicon material in certain embodiments. In certain embodiments, a first adhesion material 304 is first formed overlying the first dielectric material before deposition of the first wiring material to promote adhesion of the first wiring material to the first dielectric material. A diffusion barrier material 306 may also be formed overlying the metal material to prevent the metal material to contaminate other portions of the device in a specific embodiment. In other embodiments, diffusion barrier material 306 may be optional.

Figure 4:
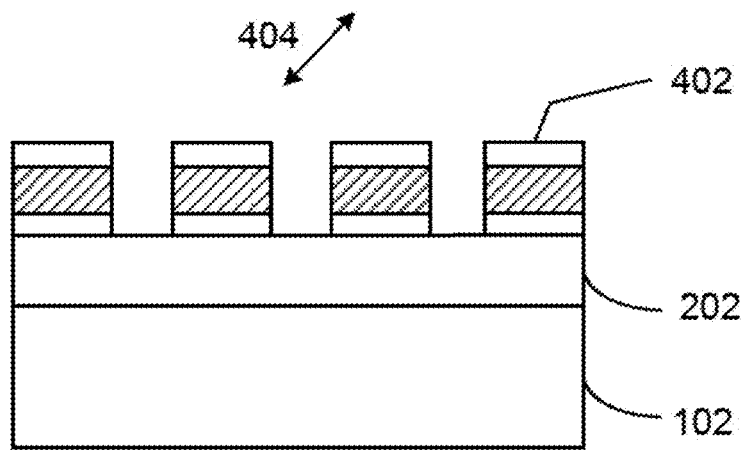
Figure 4A:
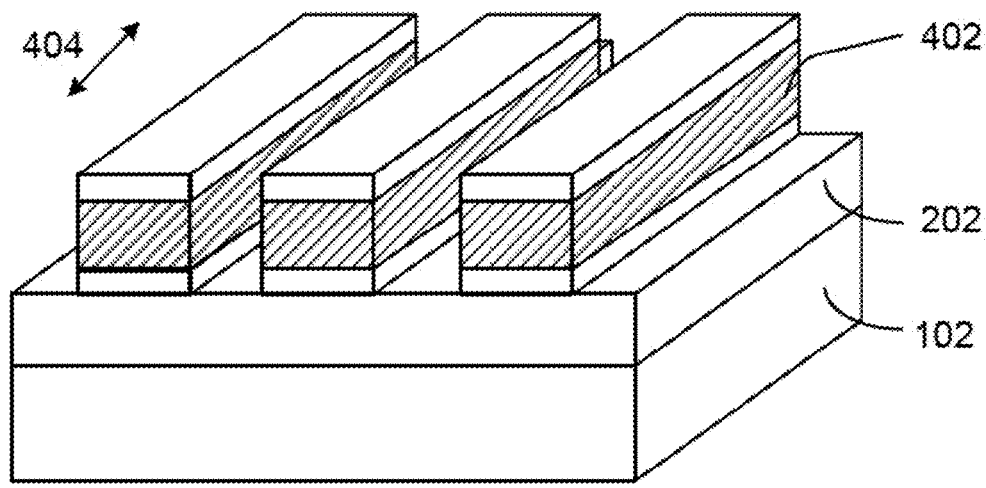
Figure 5:
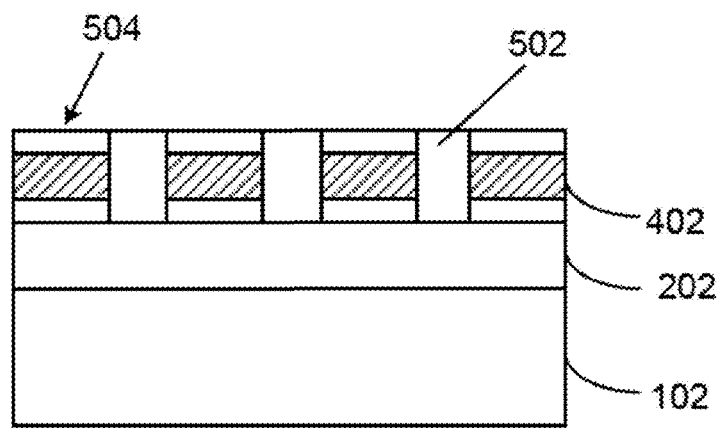
Figure 6:
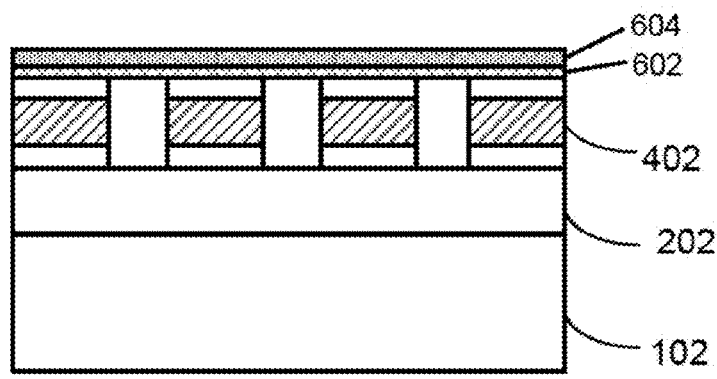

As shown in FIGS. 4 and 4A, the method subjects first wiring material 302 to a first pattern and etching process to form a first wiring structure 402 in a specific embodiment. First wiring structure 402 includes a plurality of first elongated structures configured to extend in a first direction 404 in a specific embodiment. In a specific embodiment, the method deposits a second dielectric material 502 overlying the first wiring structure. The second dielectric material can be silicon oxide, silicon nitride, a dielectric stack of alternating layers of silicon oxide and silicon nitride (for example, an ONO stack), a low K dielectric, a high K dielectric, or a combination, and others, depending on the application. Second dielectric material 502 can be subjected to a planarizing process to isolate the first wiring structure in a specific embodiment. As shown in FIG. 5, a surface region 504 of the diffusion barrier material is exposed.

In a specific embodiment, the method includes forming a polycrystalline silicon germanium material 602 overlying first wiring structure 402. Polycrystalline silicon germanium material 602 can be doped using a p+ impurity species in a specific embodiment. The p+ impurity species can be a boron bearing species, an aluminum bearing species, a gallium bearing species or an indium bearing species depending on the application. In a specific embodiment, the p+ impurity specie is provided using a boron bearing species. Depending on the embodiment, the polycrystalline silicon germanium material can be deposited overlying a nucleation material (not shown). The nucleation material can be a first silicon material deposited by a first chemical vapor deposition process using a silicon precursor such as silane, disilane, a suitable chlorosilane and a reducing species at a first deposition temperature. The first deposition temperature can range from about 420 Degree Celsius to about 475 Degree Celsius depending on the embodiment. The first silicon material can be doped or undoped, depending on the embodiment. Depending on the embodiment, the silicon germanium material can be deposited using silane, disilane, or a chlorosilane as a silicon precursor, germane ($GeH_4$) as the germanium precursor by a second chemical vapor deposition process. The second chemical vapor deposition process can include low pressure chemical vapor deposition process, plasma enhanced chemical vapor deposition process, and others at a second deposition temperature. The p+ impurity species can be provided using a boron bearing species borane, diborane, or a boron halide, for example, boron chloride depending on the application. Second deposition temperature can range from about 420 Degree Celsius to about 475 Degree Celsius. In some embodiments, polycrystalline silicon germanium material 602 is on the order of approximately 75 nm.

Referring again to FIG. 6. The method includes forming a polycrystalline silicon material 604 overlying the first wiring structure using the polycrystalline silicon germanium material as a seed material. Depending on the embodiment, polycrystalline silicon material 604 may be formed using a third chemical vapor deposition process using silane, disilane, a chlorosilane in a reducing environment, for example hydrogen, and other suitable silicon precursors. The third chemical vapor deposition process can include low pressure chemical vapor deposition process, plasma enhanced chemical vapor deposition process, and others, at a third deposition temperature. Alternatively, polycrystalline silicon material 604 may be formed using a physical vapor deposition process from a suitable silicon target material. The polycrystalline silicon material may be doped using a p type impurity species to cause a p+ type impurity characteristic in the polycrystalline silicon material in a specific embodiment. The p+ type impurity species can be provided using a boron species, an aluminum species, a gallium species, or an indium species depending on the embodiment. In a specific embodiment, the p type impurity species is boron and may be co-deposited by using a boron bearing specie such as borane, diborane, or boron chloride with the silicon precursor in a chemical vapor deposition process in a specific embodiment. Third deposition temperature can range from about 430 Degree Celsius to about 470 Degree Celsius depending on the application.

Again depending in the application, the buffer layer comprising of nucleation material (for example, the first silicon material), the p+ polycrystalline silicon germanium material, and the p+ polycrystalline silicon material can be formed in a same process chamber without breaking vacuum by merely changing various gas flows (silicon precursor, germanium precursor, dopant species, and others) in a specific embodiment. In various embodiments polycrystalline silicon material 604 may be on the order of 75 nm, or the like. In some embodiments, the thicknesses of silicon material 602 and silicon material 604 may be similar, or different. In some embodiments, the thicknesses of these layers may be changed depending upon engineering requirements.

Figure 7:
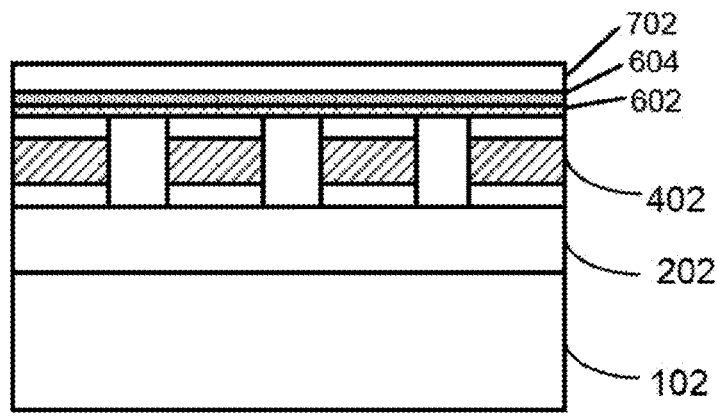

In a specific embodiment, the method includes forming a resistive switching material 702 overlying the p+ polycrystalline silicon material of the buffer material as illustrated in FIG. 7. The resistive switching material can be a second silicon material in a specific embodiment. The second silicon material can have an amorphous characteristic or a polycrystalline characteristic depending on the application. The second silicon material is not doped intentionally and has an intrinsic semiconductor characteristic in a specific embodiment. Deposition techniques for the second silicon material can include a fourth chemical vapor deposition process, a physical vapor deposition process, an atomic layer deposition (ALD) process, and others. The fourth chemical vapor deposition process can include low pressure chemical vapor deposition process, plasma enhanced chemical vapor deposition process, and others, using a silicon precursor such as silane, disilane, a chlorosilane in a reducing environment, or a combination, and others. Deposition temperature can range from about 250 Degree Celsius to about 490 Degree Celsius. In certain embodiment, deposition temperature ranges from about 350 Degree Celsius to about 440 Degree Celsius and no greater than about 450 Degree Celsius.

In some embodiments, the switching material is characterized by a state, for example, a resistance state dependent on an electric field in the switching material. In a specific embodiment, the switching material is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8A per second (T=380° C., P=2.2 Ton) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped.

Figure 8:
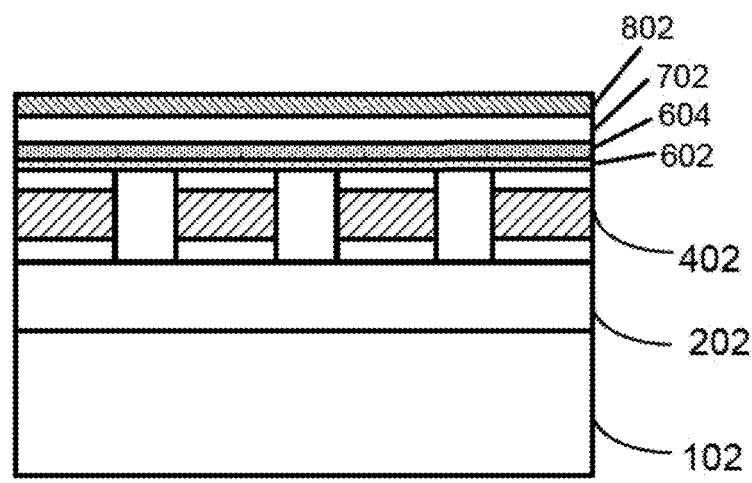

Referring to FIG. 8, the method includes forming an active conductive material 802 overlying the resistive switching material. The active conductive material can be silver, gold, palladium, platinum, zinc, aluminum, and a combination, and others. The active conductive material is characterized by a suitable diffusivity in the amorphous silicon material upon application of an electric field. For amorphous silicon material as the resistive switching material, the active conductive material can be silver, an alloy of silver, or a metal stack which at least contains silver is configured to be in direct contact with the resistive switching material, depending on the application.

In some embodiments, the active conductive silver material is in direct contact with the amorphous silicon used as the resistive switching material in a specific embodiment. In other embodiments, a thin layer of material, e.g. oxide, nitride, is formed prior to the deposition of the silver material on top of the amorphous silicon used as the resistive switching material. This interposing thin layer of material may be naturally or specifically grown or formed. In some embodiments, one or more etch operations (e.g. HF etch, Argon etch) may help control the thickness of this layer. In some embodiments, the thickness of the material (e.g. oxide) prior to deposition of the silver material may range from about 20 angstroms to about 50 angstroms; in other embodiments, the thickness may range from about 30 angstroms to about 40 angstroms; or the like. In some embodiments, an additional layer of amorphous silicon may be disposed upon the top of the thin layer of (oxide, nitride, barrier) material, prior to deposition of the silver material. This additional layer of amorphous silicon (not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a thin layer of material (e.g. oxide, nitride, barrier), a thin layer of amorphous silicon, and the silver material.

Taking again the amorphous silicon as the resistive switching material as an example. The silver material forms a silver region in a portion of the amorphous silicon material upon application of the electric filed. The silver region comprises a plurality of silver particles, including silver ions, silver clusters, silver atoms and a combination. The plurality of silver particles is formed in defect sites of the amorphous silicon material in a specific embodiment. The silver region further comprises a silver filament structure extending towards the first wiring structure. The filament structure is characterized by a length, a distance between the silver particles, and a distance between the filament structure and the first electrode structure, or the p+ polycrystalline silicon material of the buffer layer. In a specific embodiment, the resistive switching material (for example, the amorphous silicon material) is characterized by a resistance depending at least on a length, a distance between the silver particles, and a distance between the filament structure and the first electrode structure. Due to material mismatch, defect density is high at an interface region formed from the amorphous silicon material and the first wiring material, and may cause a short. The buffer layer (for example, the p+ polycrystalline silicon material formed overlying the p+ polycrystalline silicon germanium material) controls an interfacial defect density and a band gap mismatch between the amorphous silicon material and the first wiring structure for proper switching behavior of the resistive switching device in a specific embodiment.

In various embodiments, the p+ polycrystalline silicon and the p+ polycrystalline silicon germanium material further provide a suitable work function and a barrier height for the silver material to be driven towards the first electrode under a forward bias voltage. The distance between the silver particles and the first electrode can also be maintained for a suitable on-state current and provide endurance for the device. For example, the work function of p+ polysilicon material is about 5.15 eV for a barrier height of about 1.2 eV resulting in a programming voltage of less than about 5.0 eV and an endurance of greater than about $10^4$ on-off cycles. A low on state current ranging from about 100 nA to about 1 mA can be achieved depending on the deposition conditions for the amorphous silicon, resulting in a low leakage cell. However, as described, a metal material though having a similar work function as the p+ polycrystalline silicon would result in high on state current (greater than about 100 uA absent of a current compliance) or even shorts due to high defect density at the interface. Buffer material having a low work function would cause, for example, a polycrystalline or crystalline silicon material having an n type impurity characteristic (work function of about 4.05 eV) would cause the energy level of the amorphous silicon switching material to bend upwards and towards the direction that repel the metal particles from the interface region. This results in a high threshold voltage (greater than about 10 volts) for filament formation or programming. Of course one skilled in the art would recognize other modifications, variations, and alternatives.

Figure 9:
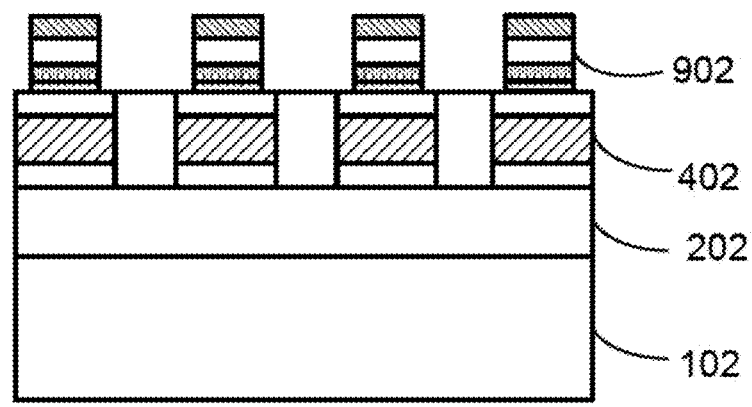
Figure 10:
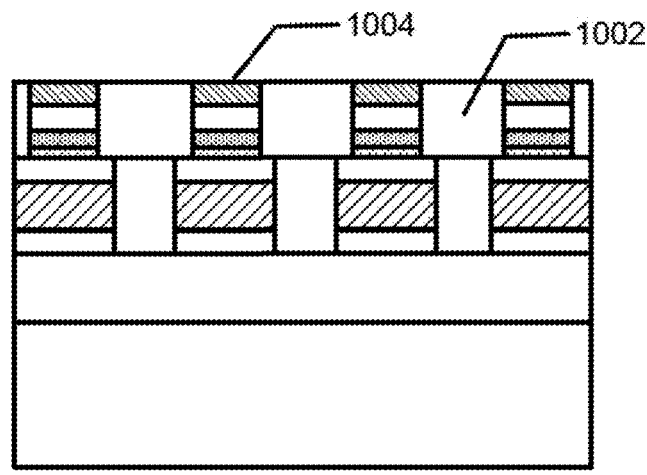

Depending on the application, various device structures can be formed. For example, as shown in FIG. 9, a stack of material including the buffer layer, the resistive switching material, and the active conductive material can be subjected to a pattern and etch process to form one or more pillar structures 902 overlying a respective first wiring structure. A second dielectric material can be formed overlying each of the one or more pillar structures and filling a gap between each of the one or more pillar structures. The second dielectric material can be subjected to a planarizing process to expose a top surface region of each of the one or more pillar structures as shown in FIG. 10. The planarizing process can be a chemical mechanical polishing process. Alternatively, an etch back process or a combination of chemical mechanical polishing process and the etch back process may be used depending on the embodiment.

Figure 11:
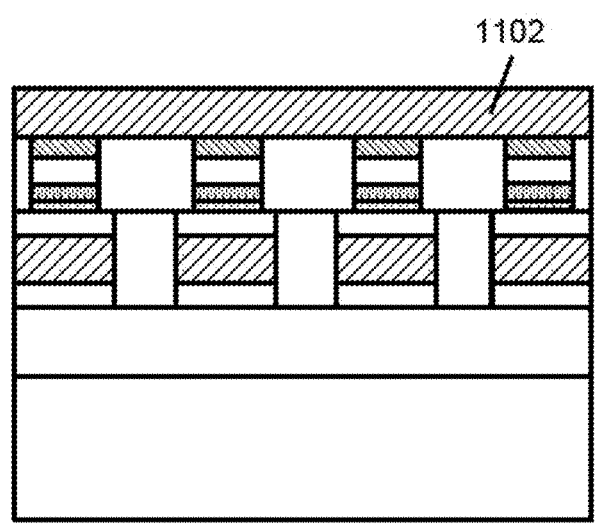

As shown in FIG. 11, a second wiring material 1102 can be formed overlying each of the pillar structures and the planarized second dielectric material. The second wiring material is subjected to a pattern and etch process to form a second wiring structure overlying the active conductive material. In a specific embodiment, the first wiring structure can be elongated and configured to extend in a first direction. The second wiring structure is elongated in shape and configured to extend in a second direction. The first direction and the second direction can be configured to be orthogonal to each other in a specific embodiment.

Alternatively, the resistive switching material can be a metal oxide material. In a specific embodiment, the metal oxide material can be a zinc oxide material formed overlying the buffer layer material. As described, the buffer layer material comprises the polycrystalline silicon material having the p+ type impurity characteristic formed overlying a polycrystalline silicon germanium material having the p+ type impurity characteristic in a specific embodiment. For zinc oxide as the resistive switching material, the active conductive material can be an aluminum doped zinc oxide material in a specific embodiment.

Accordingly, embodiments according to the present invention provide a method and device structure to form a resistive switching device for a non-volatile memory device. The method provides a buffer layer between the active metal filament structure in the resistive switching material and an electrode (for example, a metal electrode) for proper operation of the resistive switching device. The buffer layer material is characterized by a suitable bandgap, electrical conductivity, work function, and a material matching between the electrode material and the resistive switching material. The buffer layer material is further characterized by a deposition temperature no greater than about 450 Degree Celsius well suitable to be formed in a back end of CMOS process. The dopant species (for example, the boron species) are activated during deposition without an anneal process in a specific embodiment. Depending on the application, the resistive switching device can be configured in a 1 TnR approach, or n resistive switching devices controlled by one transistor device or a crossbar configuration. One skilled in the art would recognize the variations, modifications, and alternatives.

The performance (for example, endurance, retention, leakage, and switching speed, among others) of the resistive switching device can be further enhanced by providing means for controlling the filament structure. For example, the active conductive material can be configured in a via structure overlying the resistive switching material. The via structure can be formed in a portion of a suitable dielectric material overlying at least the resistive switching material. The active conductive material is in physical and electrical contact with the resistive switching material in a specific embodiment.

Figure 12:
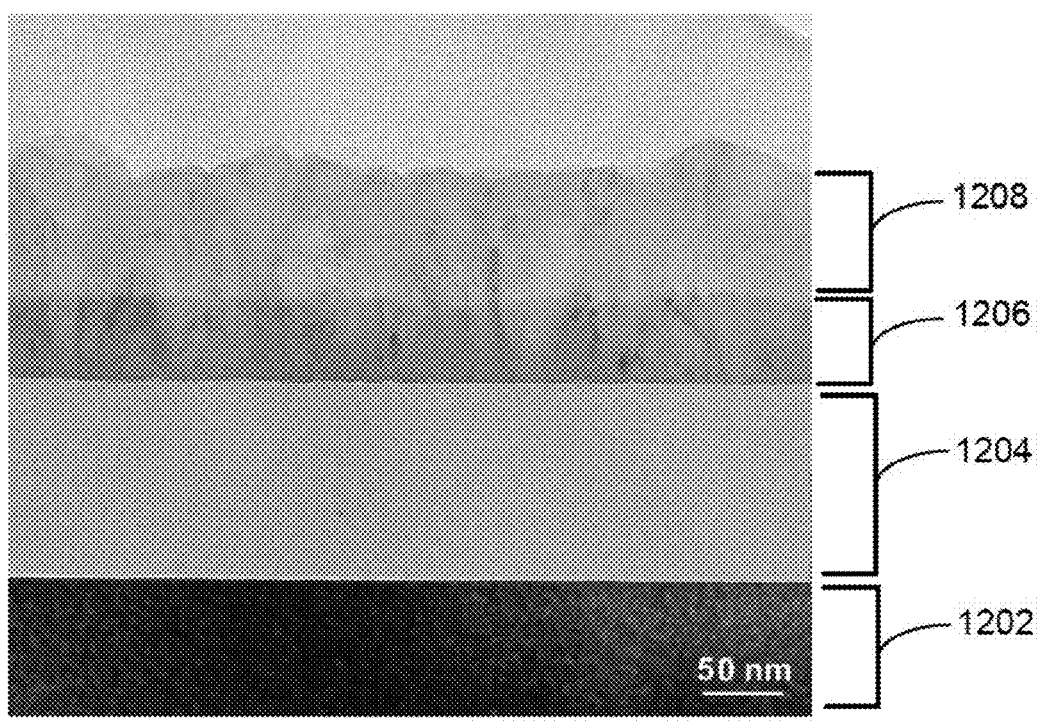
FIG. 12 is a scanning electron microscope image of a buffer layer for the resistive switching device according to an embodiment of the present invention.

FIG. 12 is a scanning electron microscope image of the buffer layer according to an embodiment of the present invention. As shown, a silicon substrate 1202 was provided. A silicon oxide material 1204 was formed overlying the silicon substrate. A p+ polycrystalline silicon germanium material 1206 formed overlying silicon oxide material 1204 and a p+ polycrystalline silicon material 1208 formed overlying the p+ polycrystalline silicon germanium material 1206 formed. P+ polycrystalline silicon germanium material 1206 and p+ polycrystalline silicon germanium material 1208 were deposited using the following parameters:

P+ polycrystalline silicon germanium deposition:
Nucleation: 5 mins, 450° C., 300 mTorr, 200 sccm SiH4
Main: 25 mins, 450° C., 400 mTorr, 170 sccm SiH4, 15 sccm GeH4, 15 sccm BCl3
P+ polycrystalline silicon deposition:
40 mins, 450° C., 400 mTorr, 185 sccm SiH4, 15 sccm BCl3

The above process parameters are merely an example, other modifications, variations and alternatives exist and would be recognized by one skilled in the art. As shown, the buffer material comprised of p+ polycrystalline silicon material 1208 overlying p+ polycrystalline silicon germanium material 1206 and was deposited overlying a silicon oxide material. Both p+ polycrystalline silicon material 1208 and p+ polycrystalline silicon germanium material 1206 are substantially crystalline and provide a desirable electric conductivity characteristic. The p+ polycrystalline silicon germanium material has a measured sheet resistance of about 0.0040 hm-cm. Depending on a thickness deposited, the p+ polycrystalline silicon material can have an amorphous silicon material formed on top. It is therefore desirable to control the p+ polycrystalline silicon material to have a thickness of no greater than about 30~50 nanometers.

Figure 13:
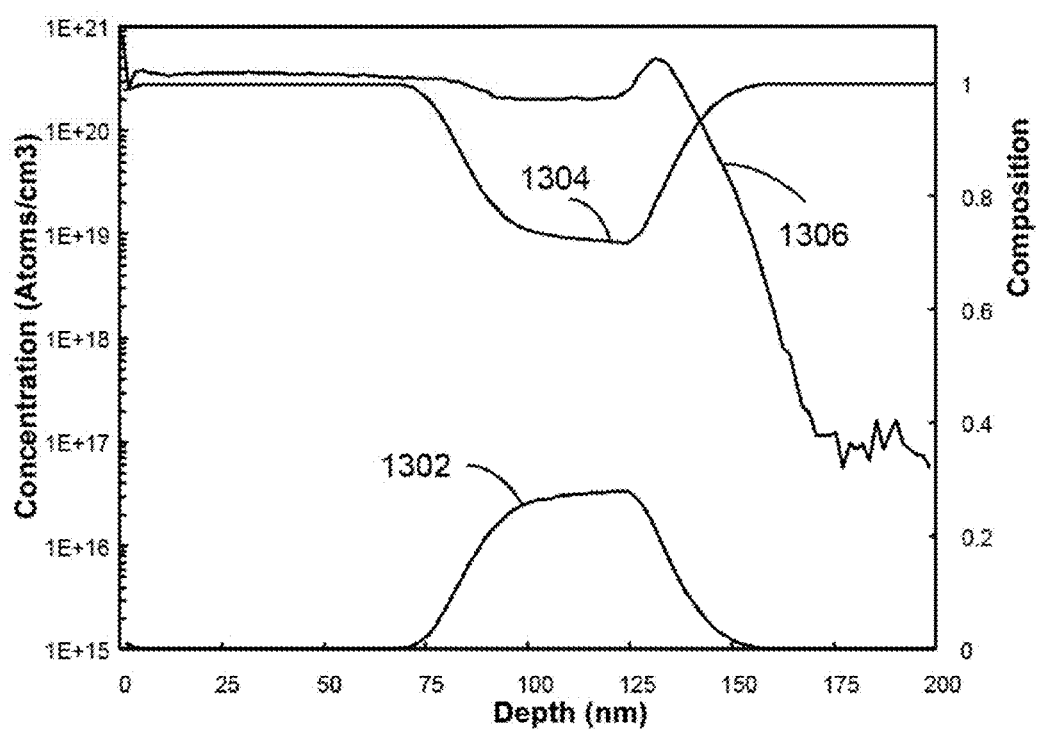
FIG. 13 is a secondary ion mass spectrometry plot of the buffer layer according to an embodiment of the present invention.

FIG. 13 is a secondary ion mass spectrometry of the buffer layer materials according to an embodiment of the present invention (for example as in FIG. 12). As shown, a plot of composition (right vertical axis) as well as concentration of the constituents (left vertical axis) as a function of depth (horizontal axis) is shown. Curve 1302 is a plot of germanium concentration as a function of depth. Curve 1304 is a plot of silicon concentration as a function of depth and curve 1306 is a plot of boron concentration as a function of depth. The silicon germanium material occurred at a depth of 75 nm from the surface. The boron concentration is about 3E20 atoms per $cm^3$ in p+ silicon material and 2E20 atoms per $cm^3$ p+ polycrystalline silicon germanium material.

Figure 14:
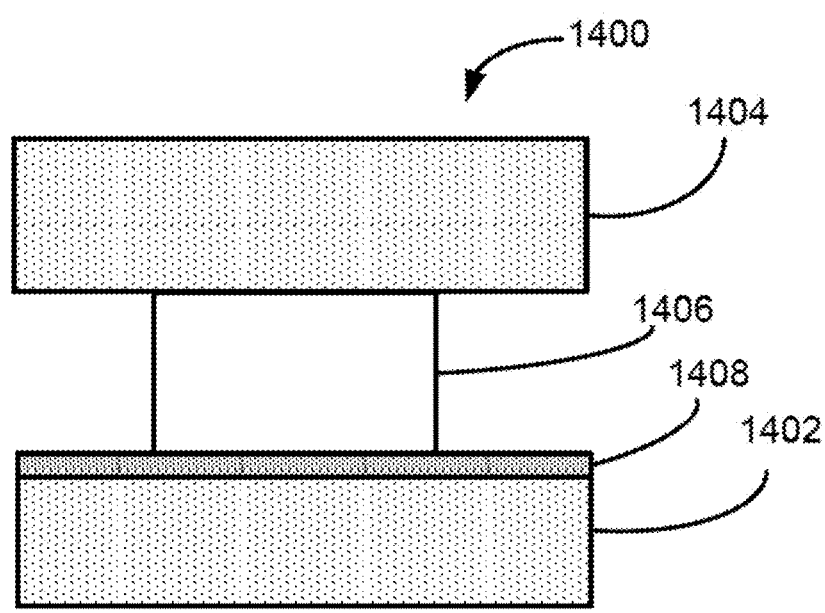
FIG. 14 is a simplified diagram illustrating a resistive switching device for a non-volatile memory device according to an embodiment of the present invention.

In a specific embodiment, a resistive switching device 1400 for a memory device is provided as shown in FIG. 14. The resistive switching device includes a first electrode 1402, a second electrode 1404, and a resistive switching material 1406 configured in an intersection region between the first electrode and the second electrode. Second electrode 1404 includes at least an active conductive material and the resistive switching material is configured to be in physical and electrical contact with the active conductive material. In a specific embodiment, a buffer layer material 1408 comprising one or more silicon material having a p+ impurity characteristic is disposed in between the first electrode and the resistive switching material. Depending on the application, the first electrode and the second electrode can each include a wring structure using metal material selected from silver, copper, tungsten, aluminum, or a combination. In other embodiments, the wiring structure for each of the first electrode and the second electrode can be a doped semiconductor material.

Referring to FIG. 14, resistive switching material 1406 can include a silicon material having an intrinsic semiconductor characteristic. In a specific embodiment, the silicon material can be an amorphous silicon material or an amorphous silicon germanium material having an intrinsic semiconductor characteristic. In other embodiments, resistive switching material 1406 can include a metal oxide material such as a zinc oxide material.

Figure 15:
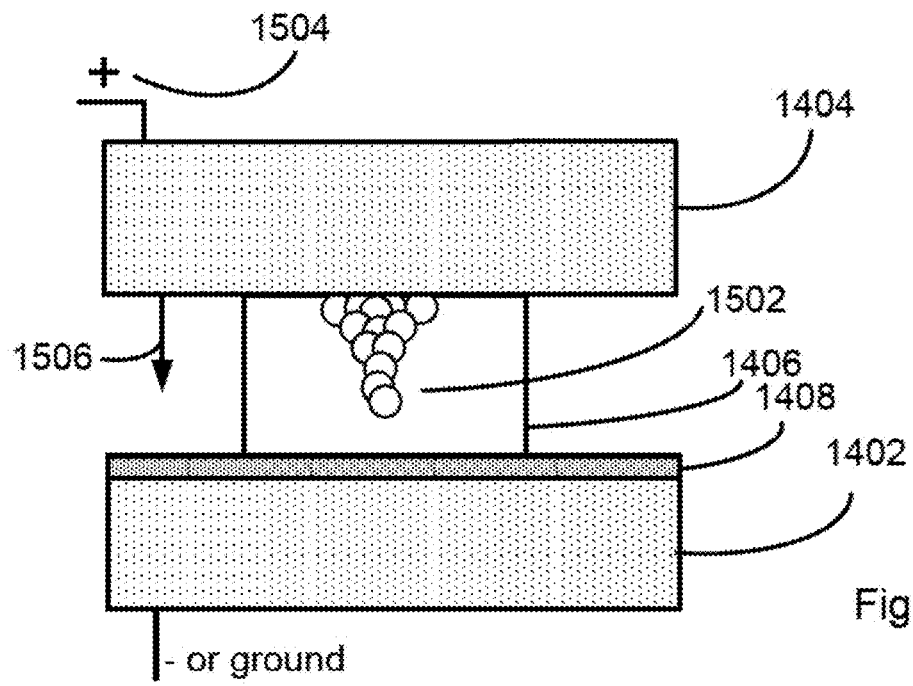
FIGS. 15-16 are simplified diagrams illustrating operations of the resistive switching device for a non-volatile memory device according to an embodiment of the present invention.

Referring to FIG. 15, the active conductive material forms a conductive material region 1502 in a portion of the resistive switching material upon application of a forward bias voltage or programming voltage 1504. The forward bias voltage is a positive voltage applied to second electrode 1404 with respect to the first electrode 1402 for amorphous silicon switching material and silver as the active conductive material. As shown, active material region further includes a filament structure configured to extend 1506 towards first electrode 1402 upon application of the forward bias voltage. Buffer material 1408 is characterized by a work function, bandgap, and electrical conductivity such that a suitable energy barrier exists between the filament structure and the buffer material for a controllable on-state current absent of a current compliance upon application of a programming voltage. In a specific embodiment buffer material 1408 can include a polycrystalline p+ silicon germanium material or a polycrystalline p+ silicon material, or a combination. In a specific embodiment, buffer material 1408 includes a p+ polycrystalline silicon material overlying a p+ polycrystalline silicon germanium material and the resistive switching material is in physical and electric contact with the p+ polycrystalline silicon material. As noted, p+ polycrystalline silicon material has a work function of about 5.15 eV particular suited for amorphous silicon material as the resistive switching material and silver as the active conductive material, for proper switching and desirable on state current, and endurance of the device. Additionally, the desirable on-state current is controllable in absence of a current compliance. As merely an example, the on state current can range from about 100 nA to no greater than 1 mA depending on device feature size and deposition condition of the amorphous silicon material.

Figure 16:
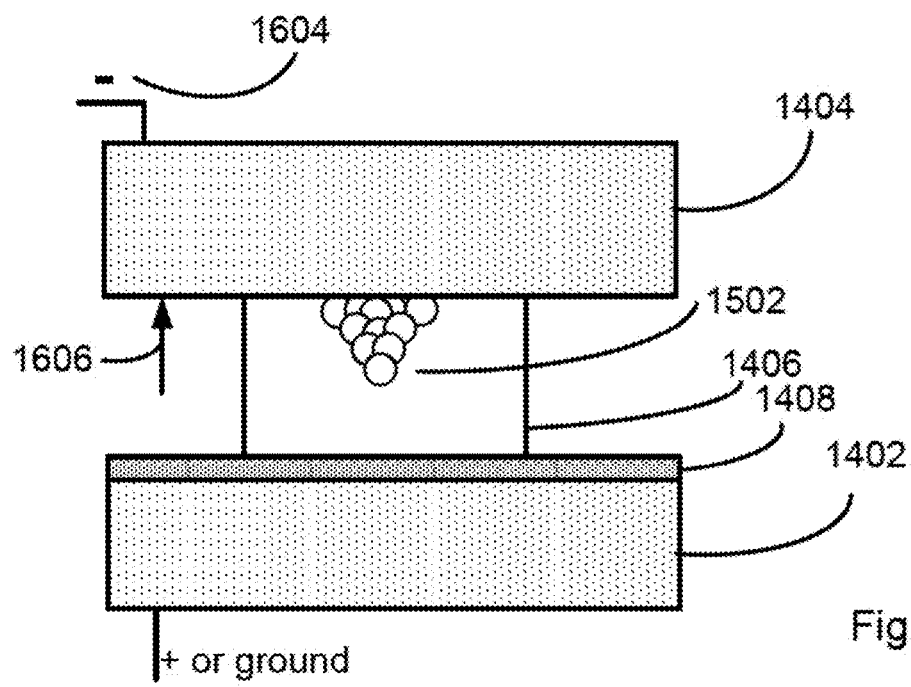

As illustrated in FIG. 16, when a reverse bias voltage 1604 is applied to the second electrode after programming, filament structure 1502 retracts 1606 and the resistive switching device is in a high resistance state or an off state. The buffer material allows the filament structure to extend upon application of the forward bias voltage for programming and to retract upon application of the reverse bias voltage after programming. Endurance of the resistive switching device can be greater than $10^4$ cycles, well suited for a non-volatile memory device. Of course, one skilled in the art would recognize other variations, modifications, and alternatives.

Though the present invention has been exemplified in various embodiments, it is to be understood that the examples and embodiment described herein are for illustrative purpose only and that various modifications or alternatives in light thereof will be suggested to persons skilled in the art and are to be included within the spirit and purview of this application and scope of the appended claims.

What is claimed is:

1. A method of forming a non-volatile memory device, comprising:
    providing a substrate having a surface region;
    forming a first dielectric material overlying the surface region of the substrate;
    forming a first electrode structure overlying the first dielectric material;
    forming a polycrystalline silicon germanium material overlying the first electrode structure, the polycrystalline silicon germanium material having a first p+ impurity characteristic;
    forming a polycrystalline silicon material overlying the first electrode structure using the polycrystalline silicon germanium material as a seed layer, the polycrystalline silicon material being formed at a deposition temperature ranging from about 430 Degree Celsius to about 475 Degree Celsius, the polycrystalline silicon material being characterized by a second p+ impurity characteristic;
    forming a resistive switching material overlying the polycrystalline silicon material; and
    forming a second electrode structure overlying the resistive switching material, the second electrode structure comprising at least a portion comprising an active conductive material overlying the resistive switching material.

2. The method of claim 1 wherein the polycrystalline silicon germanium material having the first p+ impurity characteristic and the polycrystalline silicon material characterized by a second p+ impurity characteristic form a buffer material between the resistive switching material and the first electrode structure.

3. The method of claim 1 further comprises forming a nucleation material for the polycrystalline silicon germanium material overlying the first electrode structure, the nucleation material comprising a silicon material.

4. The method of claim 3 wherein the polycrystalline silicon germanium material is deposited using a silicon precursor selected from a group consisting of: silane, disilane, and a chlorosilane, at a deposition temperature ranging from about 420 Degree Celsius to about 475 Degree Celsius.

5. The method of claim 1 wherein the polycrystalline silicon germanium material has a p+ type semiconductor impurity characteristic provided by a species selected from a group consisting of: a boron bearing species, an aluminum bearing species, a gallium bearing species, and an indium bearing species.

6. The method of claim 1 wherein the polycrystalline silicon germanium material is formed by using a process selected from a group consisting of: a plasma enhanced chemical vapor deposition process, a low pressure chemical vapor deposition process, and an implantation process.

7. The method of claim 1 wherein the p+ type impurity is provided by a species selected from a group consisting of: a boron bearing species, an aluminum bearing species, a gallium bearing species, and an indium bearing species.

8. The method of claim 1 wherein the polycrystalline silicon material is formed by using a process selected selected from a group consisting of: a plasma enhanced chemical vapor deposition process, and a low pressure chemical vapor deposition process.

9. The method of claim 1 wherein the resistive switching material is selected from a group consisting of: a metal oxide, a zinc oxide, and an oxide material.

10. The method of claim 1 wherein the resistive switching material is selected from a group consisting of: an amorphous silicon germanium material having an intrinsic semiconductor characteristic and not doped intentionally, an amorphous silicon material having an intrinsic semiconductor characteristic and not doped intentionally.

11. The method of claim 1 wherein the first p+ impurity characteristic and the second p+ impurity characteristic are activated during the respective forming processes free of an anneal process.

12. The method of claim 1 further comprising disposing a thin barrier layer between the resistive switching material and the second electrode structure.

13. A method of forming a non-volatile memory device, comprising:
    providing a substrate having a first dielectric material formed thereon, wherein the substrate comprises a plurality of CMOS devices formed therein;
    forming a first electrode structure overlying the first dielectric material;
    forming a buffer material layer comprising:
    forming a first buffer material layer comprising polycrystalline silicon and germanium containing material overlying the first electrode structure, wherein the first buffer material comprises a first p+ impurity characteristic; and
    forming a second buffer material layer comprising polycrystalline silicon containing material using the first buffer material layer as a seed layer, wherein the second buffer material layer is formed at a deposition temperature ranging from about 430 Degree Celsius to about 475 Degree Celsius, wherein the second buffer material comprises a a second p+ impurity characteristic;
    forming a resistive switching material layer overlying the buffer material layer; and
    forming a second electrode structure overlying the resistive switching material layer, wherein the second electrode structure comprises at least a portion comprising an active conductive material overlying the resistive switching material layer.

14. The method of claim 13 wherein the forming the buffer material layer further comprises:
    prior to forming the first buffer material layer: initiating a vacuum within a deposition chamber; and
    wherein the forming the second buffer material layer comprises: without breaking the vacuum within the deposition chamber, forming the second buffer material layer.

15. The method of claim 14 wherein the forming the second buffer material layer further comprises: changing gas flows within the deposition chamber between the forming the first buffer material layer and the forming the second buffer material layer.

16. The method of claim 13 further comprising forming a thin layer of material overlying the resistive switching material layer prior to forming the active conductive material overlying the resistive switching material layer.

17. The method of claim 16 wherein the thin layer of material is selected from a group consisting of: an oxide, a nitride, a barrier material.

18. The method of claim 16 wherein a thickness of the thin layer of material is within a range of about 20 angstroms to about 50 angstroms.

19. The method of claim 13 wherein a thickness of buffer material is associated with an on-state current within a range of about 100 nA to about 1 mA.

20. The method of claim 13 wherein the resistive switching material is selected from a group consisting: a metal oxide, a zinc oxide, an oxide material.

21. The method of claim 20 wherein the active conductive material comprises aluminum doped zinc oxide.

22. The method of claim 13 wherein the active conductive material is selected from a group of materials consisting of: silver, gold, palladium, platinum, zinc, andaluminum.

* * * * *